(12) United States Patent
Zhang

(10) Patent No.: US 12,015,028 B2
(45) Date of Patent: Jun. 18, 2024

(54) TRANSISTOR MODULE AND ITS ASSOCIATED SEMICONDUCTOR MODULE

(71) Applicant: Hangzhou Kiwi Instruments Corporation, Hangzhou (CN)

(72) Inventor: Bo Zhang, Hangzhou (CN)

(73) Assignee: HANGZHOU KIWI INSTRUMENTS CORPORATION, Hangzhou (CN)

( * ) Notice: Subject to any disclaimer, the term of this patent is extended or adjusted under 35 U.S.C. 154(b) by 180 days.

(21) Appl. No.: 17/038,630

(22) Filed: Sep. 30, 2020

(65) Prior Publication Data

US 2021/0104519 A1 Apr. 8, 2021

(30) Foreign Application Priority Data

Oct. 8, 2019 (CN) .......................... 201910950314.0

(51) Int. Cl.
| | |
|---|---|
| *H01L 27/088* | (2006.01) |
| *H02M 1/00* | (2006.01) |
| *H02M 1/36* | (2007.01) |
| *H02M 3/158* | (2006.01) |
| *H02M 3/335* | (2006.01) |

(52) U.S. Cl.
CPC ........... *H02M 1/36* (2013.01); *H02M 1/0006* (2021.05); *H02M 1/0009* (2021.05); *H02M 3/158* (2013.01); *H01L 27/0883* (2013.01); *H02M 3/33507* (2013.01)

(58) Field of Classification Search
None
See application file for complete search history.

(56) References Cited

U.S. PATENT DOCUMENTS

| | | | |
|---|---|---|---|
| 6,259,618 B1 | 7/2001 | Liaw et al. | |
| 8,207,580 B2 | 6/2012 | Parthasarathy et al. | |
| 8,873,255 B2* | 10/2014 | Chou | H02M 1/44 363/49 |
| 2007/0285141 A1* | 12/2007 | Yang | H02M 3/158 327/198 |
| 2011/0309810 A1* | 12/2011 | Willmeroth | H02M 1/36 323/312 |
| 2017/0005583 A1* | 1/2017 | Choi | H02M 3/33553 |
| 2018/0232000 A1* | 8/2018 | Nilson | G05F 3/16 |
| 2018/0275709 A1* | 9/2018 | Chen | H01L 27/0629 |
| 2021/0217342 A1* | 7/2021 | Hu | G11C 19/28 |
| 2021/0359679 A1* | 11/2021 | Chen | H03K 17/6872 |

FOREIGN PATENT DOCUMENTS

| | | |
|---|---|---|
| CN | 103219898 | 6/2016 |
| CN | 210578244 U | 5/2020 |

\* cited by examiner

*Primary Examiner* — Alex Torres-Rivera
(74) *Attorney, Agent, or Firm* — Perkins Coie LLP

(57) ABSTRACT

A transistor module including a first transistor and a second transistor for start up control is provided. Wherein the first end of the first transistor is coupled to the first end of the second transistor, the second end of the first transistor is coupled to the control end of the second transistor, and the second end of the second transistor provides a start up current for a control circuit.

5 Claims, 5 Drawing Sheets

TRANSISTOR MODULE AND ITS ASSOCIATED SEMICONDUCTOR MODULE

CROSS-REFERENCE TO RELATED APPLICATIONS

This application claims priority to and the benefit of Chinese Patent Applications No. 201910950314.0, filed on Oct. 8, 2019, which is incorporated herein by reference in its entirety.

TECHNICAL FIELD

The present invention relates generally to electronic circuit, and more particularly but not exclusively relates to transistor module and its associated semiconductor module.

BACKGROUND

In power supply systems, start up circuits are adopted to provide start up current for the control circuit at the start up stage before the control circuit provides pulses to a power transistor. Resistor is widely used in start up circuit to generate current from the input power source for providing start up current and power to the control circuit. FIG. 1 illustrates a prior art start up circuit which comprises a start up resistor Rs. When the power converter starts to work and at start up stage, the input voltage and resistor Rs generates a charging current for charging capacitor Cdd, and for providing power to the control circuit (shown as IC), and the system starts to work. At operation stage, the control circuit is supplied power by a supply circuit instead, for example, the control circuit is supplied by the voltage generated at auxiliary winding Na instead, where the energy in auxiliary winding is transferred from switching action of the power transistor.

However, the resistor Rs consumes much energy continuously, even in operation stage, and power consumption is high. Further, in order to lower down the power consumption, the impedance of the start up resistor Rs is usually set high and accordingly the start up current is very low which prolongs the start up time period.

Meanwhile, resistor with high impedance is hard for integration considering semiconductor processing complexity, large chip size and high cost, and an external discrete resistor is usually adopted instead which adds on system volume.

In view of at least one of the above deficiencies, an improved solution is required.

SUMMARY

In one embodiment, a transistor module comprises: a first transistor having a first end, a second end and a control end; and a second transistor configured to provide start up current for a control circuit, the second transistor having a first end, a second end and a control end, wherein the first end of the first transistor is coupled to the first end of the second transistor, the second end of the first transistor is coupled to the control end of the second transistor, and the second end of the second transistor is configured to provide the start up current.

In another embodiment, a transistor module comprises: a start up circuit for providing a start up current for a control circuit; and a power transistor controlled by the control circuit; wherein the transistor module having: a first terminal coupled to a first end of the power transistor; a second terminal coupled to a second end of the power transistor; a third terminal coupled to a control end of the power transistor; and a fourth terminal coupled externally to a first terminal of the control circuit; and wherein at start up stage, an input current having a first current value flows into the first terminal, and a current having the first current value flows from the fourth terminal to the first terminal of the control circuit for providing a start up current for the control circuit; and at operation stage, no current flows through the fourth terminal.

And in yet another embodiment, a semiconductor module comprises: a start up circuit configured to provide a start up current for a control circuit, the start up circuit comprising a depletion mode transistor; and a power transistor comprising an enhancement mode transistor controlled by the control circuit, wherein the gate of the depletion mode transistor is coupled to the source of the enhancement mode transistor and the source of the depletion mode transistor is configured to provide the start up current.

BRIEF DESCRIPTION OF THE DRAWINGS

Non-limiting and non-exhaustive embodiments are described with reference to the following drawings. The drawings are only for illustration purpose. Usually, the drawings only show part of the circuits/devices of the embodiments.

Figure 1:
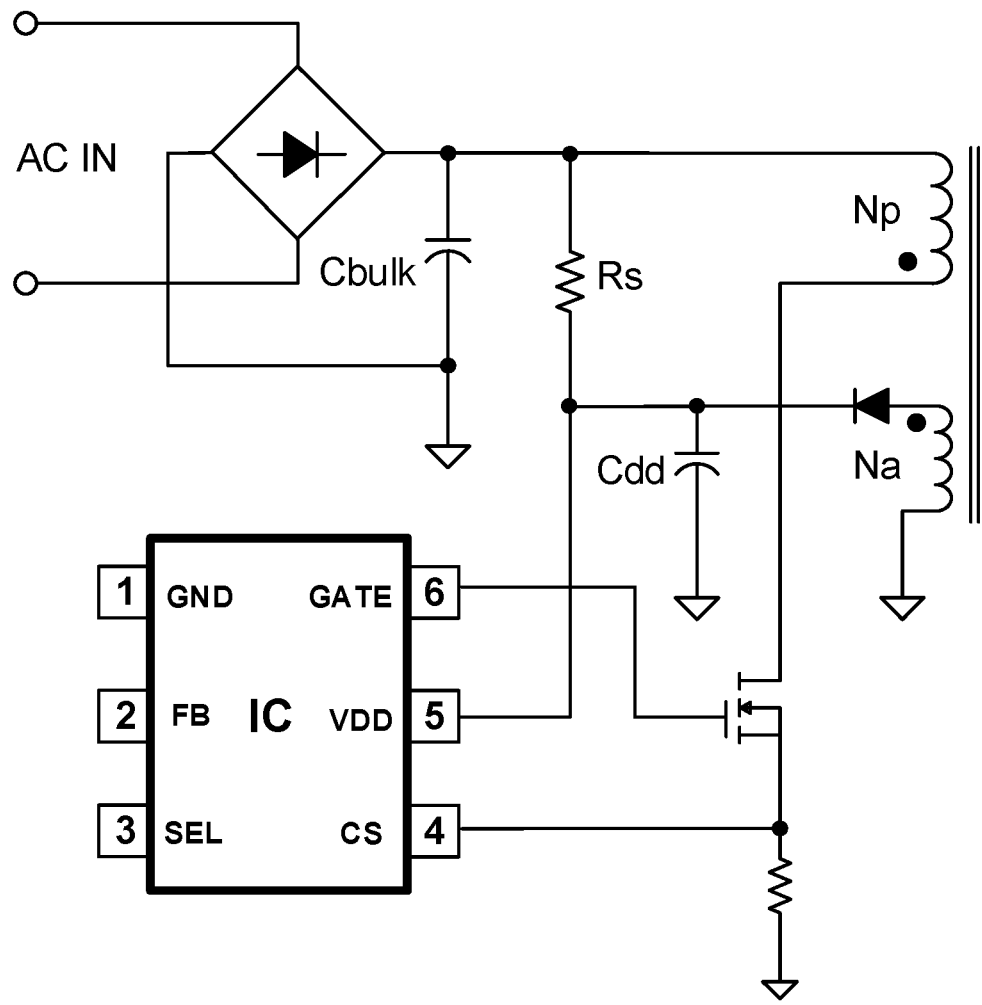
FIG. 1 illustrates a prior art start up circuit comprising a start up resistor.

The drawings are only schematic and are non-limiting. In the drawings, the size is not drawn on scale. In the different drawings, the same reference signs refer to the same or similar components/elements.

DETAILED DESCRIPTION

Reference will now be made in detail to the preferred embodiments of the application, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Throughout the specification and claims, the term "couple" as used herein, is defined as either directly, or indirectly connecting one to another via intermediary such as via electrical conducting materials which may have resistance, parasitic inductance or capacitance, or via other material(s) or component(s) as would be known to person skilled in the art without departure from the spirit and scope of the invention as defined by the appended claims.

Figure 2:
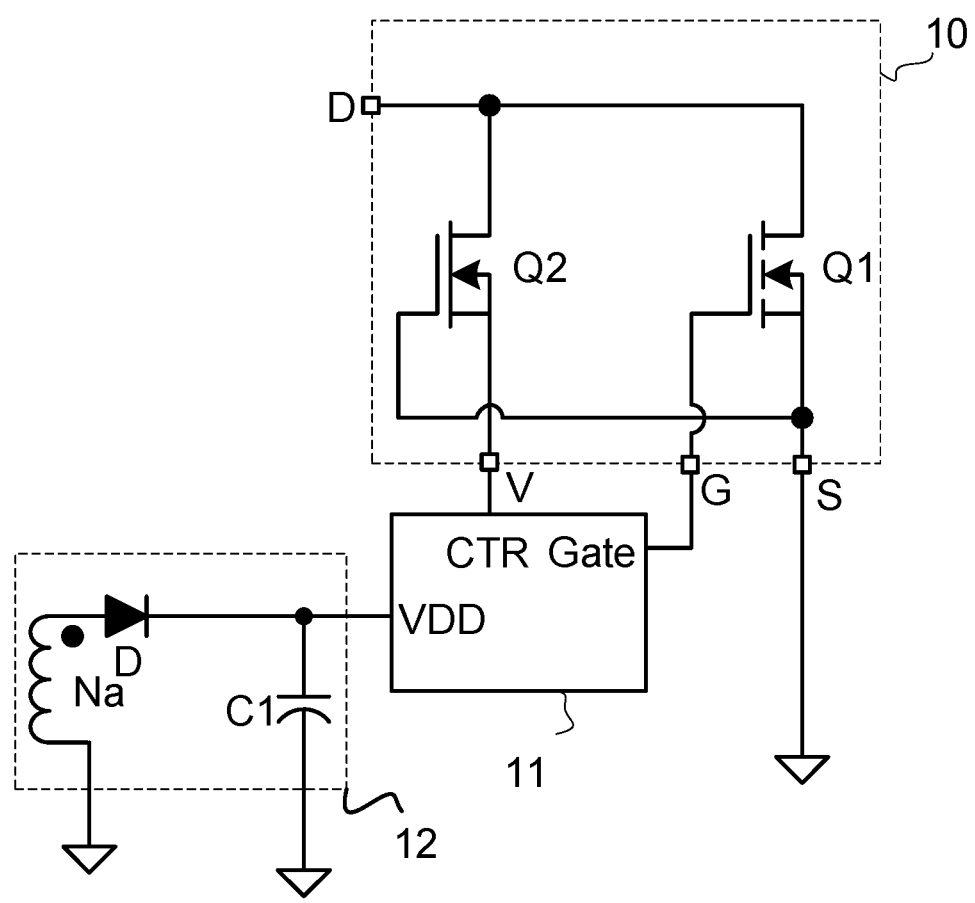
FIG. 2 illustrates a circuit diagram of a transistor module according to an embodiment of the present invention.

FIG. 2 illustrates a circuit diagram of a transistor module 10 according to an embodiment of the present invention. Transistor module 10 integrates start up function, and comprises a first transistor Q1 functioning as a power transistor for a power converter and a second transistor Q2 functioning as a start up circuit. Wherein the first transistor Q1 has a first end coupled to terminal D of the transistor module 10, a second end coupled to terminal S, and a control end coupled to terminal G of transistor module 10. The second transistor Q2 provides a start up current at terminal V for providing start up current to a control circuit 11. The second transistor Q2 has a first end coupled to terminal D, a second end coupled to terminal V and a control end coupled to terminal S. Specifically, the first end of the second transistor Q2 is coupled to the first end of the first transistor Q1, the control end of the second transistor Q2 is coupled to the second end of the first transistor Q1 and the second end of the second transistor Q2 provides the start up current.

Correspondingly, the transistor module 10 has four terminals, including the first terminal D, the second terminal S, the third terminal G and a fourth terminal V. Wherein the first terminal D is coupled to the first end of the transistor Q1 and the first end of transistor Q2, the second terminal S is coupled to the second end of the first transistor Q1 and the control end of the second transistor Q2, the third terminal G is coupled to the control end of the first transistor Q1 and the fourth terminal V is coupled to the second end of the second transistor Q2. In FIG. 1, the four terminals are named a drain terminal D, a source terminal S, a control terminal G and a start up terminal V respectively.

In a preferred embodiment, the transistor module 10 is manufactured on a semiconductor substrate independently to form a semiconductor chip, and wherein the four terminals D, S, G and V are in forms of four pins. In one embodiment, a semiconductor chip manufactured with the transistor module 10 is encapsulated in a package. In another embodiment, a semiconductor chip of the transistor module 10 and a control chip of the control circuit 11 are encapsulated in a package with multi-chip packaging technology.

In another embodiment, the transistor module 10 and other circuits are manufactured on a semiconductor substrate to form a semiconductor chip and some of the terminals D, S, G and V are inside the semiconductor chip or inside an IC package.

Externally, the fourth terminal V of the transistor module 10 is coupled to a first terminal CTR of the control circuit 11, in order to provide start up current for the control circuit 11. The third terminal G of the transistor module 10 is coupled to a second terminal Gate of the control circuit 11, in order to receive a control signal for controlling the first transistor Q1. At start up stage when the power transistor Q1 has not been properly driven by the control circuit 11, the input impedance at the first terminal CTR of the control circuit 11 is low, and the second transistor Q2 is in ON state (conduction state), current flows through the second transistor Q2 from the first terminal D of the transistor module 10 to the fourth terminal V of the transistor module 10. The current functions as the start up current to charge capacitor C1 at a third terminal VDD of the control circuit 11, the start up voltage at terminal VDD increases, and the control circuit starts to provide driving signals for driving the first transistor Q1 when the voltage VDD exceeds a threshold. In one embodiment, a device or a circuit with resistance is coupled inside control circuit 11 between the first terminal CTR and the third terminal VDD of control circuit 11. In one embodiment, one end of the capacitor 12 is coupled at terminal CTR. When the first transistor Q1 is at operation state, capacitor C1 is charged by other power supply circuit such as the auxiliary winding Na through a diode D for supplying the control circuit 11, the voltage at VDD is high, the input impedance at the first terminal CTR of the control circuit 11 is in high level, and the second transistor Q2 is in OFF state.

In one embodiment, the first transistor Q1 is the power transistor of a power converter, such as a switching mode power supply like a flyback converter. And at start up stage, before the control circuit 11 providing effective driving signals, the first transistor Q1 is in OFF state; at operation stage, the transistor Q1 is in operation stage, preferably works in switching state when controlled by the switching control signal Gate provided by the control circuit 11, such that the power converter may provide output voltage for driving the load. Preferably, the switching control signals Gate are Pulse Width Modulation (PWM) signals.

In another embodiment, the first transistor Q1 forms part of a power transistor of a power converter, and the transistor Q1 and other parallelly coupled transistor compose the power transistor in a power converter, for example, the power transistor of a buck converter, a flyback converter or a boost converter. In another embodiment, the operation state of the first transistor Q1 can be in resistance-varying region or linear state, as a power transistor of a linear circuit.

Preferably, the first transistor Q1 comprises an enhancement mode transistor, and the second transistor Q2 comprises a depletion mode transistor. When the system starts, the input impedance at the first terminal CTR of the control circuit 11 is very low, for example, lower than a first value, the voltage at the start up terminal V and the source terminal S are both in low voltage, the voltage difference between start up terminal V and source terminal S which is the source-gate voltage of the depletion mode transistor Q2 is lower than a first threshold, the original channel of the second transistor Q2 exists, and transistor Q2 is in ON state, and the conducting impedance between terminal D and terminal V is low, for example, lower than a third resistance value, current flows through transistor Q2 from terminal D to the source of transistor Q2 (terminal V) to form a start up current, and the start up current charges capacitor C1 for supplying the control circuit 11. During start up stage, control circuit 11 does not work in normal state, the voltage at the second terminal Gate of the control circuit 11 is still in low level, and the voltage at terminal G of the transistor module 10 is lower than a third threshold, and transistor Q1 is in OFF state. When the system enters operation stage, the control circuit 11 provides driving signals at terminal Gate to drive the first transistor Q1 in operation state, the voltage at control terminal G of the transistor module 10 is in high level, for example higher than a fourth threshold, for at least part of time, for example to switch the first transistor Q1 with PWM signal or to control the conduction level of the first transistor Q1. For example, at operation stage, the first transistor Q1 is in switching state, and the voltage at control terminal G presents high level voltage periodically. Or if the first transistor Q1 works in linear state, the voltage at control terminal G remains in high level continuously. At the operation stage, the control circuit is supplied energy by other supply circuit, for example, by the auxiliary winding Na in an isolated power converter. At this stage, the input impedance at the first terminal CTR of the control circuit 11 is high, for example higher than a second resistance value, the voltage at the start up terminal V is at high level voltage, the voltage difference between the start up terminal V and the source terminal S (or the source-gate voltage of transistor Q2) is high than an off threshold (second threshold), the conduction channel of transistor Q2 is pinched off and the original conduction channel disappears, and thus the second transistor Q2 is in OFF state. Meanwhile, the resistance between the first terminal D and the fourth terminal V of the transistor module is high, for example higher than a fourth resistance value. Wherein, the first threshold is lower than the second threshold, the first value (or first resistance value) is lower than the second value, the third value is lower than the fourth value, and the third threshold is lower than the fourth threshold. It is noted that the parameters of the first threshold, the second threshold, the first value, the second value, the third value, the fourth value, the third threshold and the fourth threshold can be any suitable reference value for illustrating the characteristic of the corresponding embodiments which may be not fixed or set inside the circuits.

Accordingly, start up function can be achieved without using high-voltage integrating resistor, or using external resistor, and power consumption of the start up circuit during normal operation stage is very low since the impedance between terminals D and V is very high at operation stage, while the impedance of the start up circuit between terminals D and V is very low during start up stage and the start up current is high, and the start up speed is also high.

Figure 3:
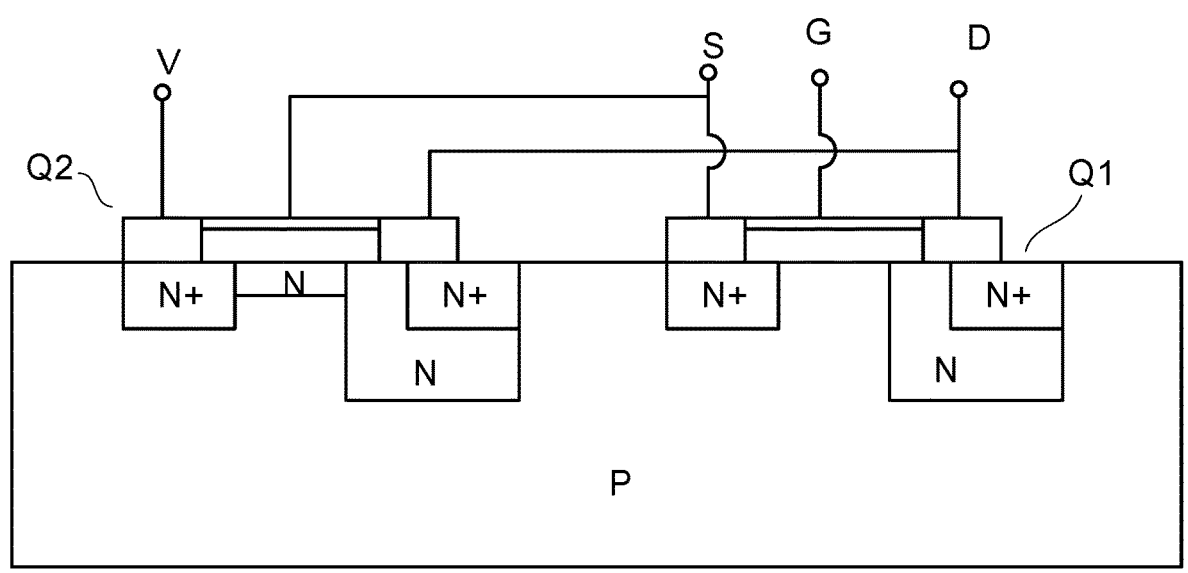
FIG. 3 illustrates a sectional view of a semiconductor module according to an embodiment of the present invention.

FIG. 3 illustrates a sectional view of a semiconductor module according to an embodiment of the present invention. The semiconductor module functions as a transistor module. The semiconductor module comprises a first transistor Q1 and a second transistor Q2. Wherein the first transistor Q1 functions as a power transistor and its conduction state is controlled by a control circuit at terminal G. The second transistor Q2 functions as a start up circuit and provides start up current for the control circuit. The semiconductor module has a first terminal D, coupled to a first end of the power transistor Q1 and a first end of the second transistor Q2; a second terminal S coupled to a second end of the power transistor Q1 and a control end of the transistor Q2; a third terminal G, coupled to a control end of the first transistor Q1; and a fourth terminal V, coupled internally to a second end of transistor Q2 and coupled externally to a control circuit for providing start up current. In the shown embodiment, the power transistor Q1 comprises an enhancement mode Field Effect Transistor (FET), and when the voltage at the control terminal G is low (Vgs<Vth1), the power transistor Q1 is in OFF state, and when the voltage at the terminal G is high (Vgs>Von), for example, higher than a threshold Von, the power transistor Q1 is in ON state. The second transistor Q2 comprises a depletion mode FET, and the control end of transistor Q2 is coupled to the source of the power transistor Q1. Wherein, the drain of the Q1 is coupled to the drain of Q2, and functions as a first terminal D of the semiconductor module. The gate of Q2 is coupled to the source of Q1 and functions as a second terminal S of the semiconductor module, the gate of transistor Q1 functions as the third terminal G of the semiconductor module and the source of the second transistor functions as the fourth terminal V of the semiconductor module. The second transistor Q2 comprises an N-type enhancement mode MOSFET, and the channel of Q2 is in N-doping type, thus when the source-gate voltage of Q2 between terminals V and S is lower than a threshold, the channel of Q2 exists and transistor Q2 is in ON state, current flows through transistor Q2 from terminal D to terminal V. The N-doping channel allows high current flowing through transistor Q2, and high current charges capacitor C1 quickly and achieves fast start up. When the supply circuit 12 enters normal operation, the source voltage of transistor Q2 at terminal V is developed by the voltage at terminal CTR of control circuit which has high input impedance. And when the source-gate voltage of transistor Q2 (voltage difference between terminal V and terminal S) increases, the channel of transistor Q2 becomes narrower. And when the source-gate voltage of transistor Q2 is higher than an off threshold, the channel of transistor Q2 is finally pinched off completely, the resistance between terminal D and V is high and the transistor Q2 is in OFF state. Thus, at operation stage, no current flows through the start up circuit and the start up circuit has very low power consumption.

According to FIG. 3, the transistor module is manufactured on a semiconductor substrate to form a semiconductor chip, wherein the semiconductor chip has four terminals, including the drain terminal D, the source terminal S, the control terminal G and the start up terminal V, wherein the drain terminal D is coupled to the drain of Q1 and the drain of Q2, the source terminal S is coupled to the source of Q1, the control terminal G is coupled to the control end of Q1 and the start up terminal V is coupled to the source of Q2 to provide start up current. In one embodiment, the four terminals are in form of four pins. In other embodiment, one pin may comprise two or more sub-pins.

Referring to FIG. 2, the second terminal S of the transistor module 10 is externally coupled to a reference ground, the start up terminal V of transistor module 10 is coupled to a first terminal CTR of the control circuit 11, and the control terminal G of the transistor module 10 is coupled to a second terminal Gate of control circuit 11. In one embodiment, the reference ground coupled to the terminal S is the system ground for a power converter. At start up stage, the input impedance at the first terminal CTR of the control circuit 11 is low, the voltages at terminals V and S are low, and the source-gate voltage of Q2 is lower than a first threshold, transistor Q2 is in ON state and the resistance between terminal D and terminal V is low.

During operation stage, the power transistor Q1 works normally and delivers power to the supply circuit 12, and the supply circuit 12 can provide supply voltage for the control circuit 11. At this stage, the voltage at terminal CTR is high and thus the voltage at terminal V of transistor module 10 is also developed and transistor Q2 is in OFF state. At this time, the input impedance at terminal CTR of the control circuit 11 is high. In one embodiment as shown in FIG. 2, the supply circuit 12 comprises an auxiliary winding Na, a diode D and a capacitor C1. When the voltage difference between terminal V and terminal S exceeds a second threshold, transistor Q2 is in OFF state and the resistance between the first terminal D and the fourth terminal V is very high. Wherein the second threshold is higher than the first threshold.

The second terminal S of the transistor module may be further coupled to other external circuits or nodes. In one embodiment, the terminal S is externally coupled to a sensing resistor. In another embodiment, the terminal S is externally coupled to a reference ground of an input power source, and the voltage difference between terminal G and terminal S is high enough to drive transistor Q1.

Continuing with FIG. 2, at start up stage, when the transistor Q2 is in ON state, current flows into drain terminal D, and flows out of start up terminal V to the control circuit 11 for providing start up current for the control circuit 11. At this stage, the control circuit 11 has not yet provided driving signal properly, and the voltage at control terminal G is low, for example, lower than a third threshold, and transistor Q1 is not in normal operation. During operation stage, the control circuit is supplied power by the supply circuit 12, transistor Q2 is in OFF state, no current flows in or out of terminal V, and at this stage, the voltage at terminal G is high, for example higher than a fourth threshold, for at least part of time for driving transistor Q1 to turn on Q1. Wherein the fourth threshold is higher than the third threshold.

Start up function is provided in a transistor module by coupling the gate of the start up transistor Q2 to the source of power transistor Q1 inside the module, and the pins number of a corresponding semiconductor chip with integrated start up circuit and power transistor is small which only requires four external terminals/pins. Thus, the circuit has a high integration density with simple control.

Figure 4:
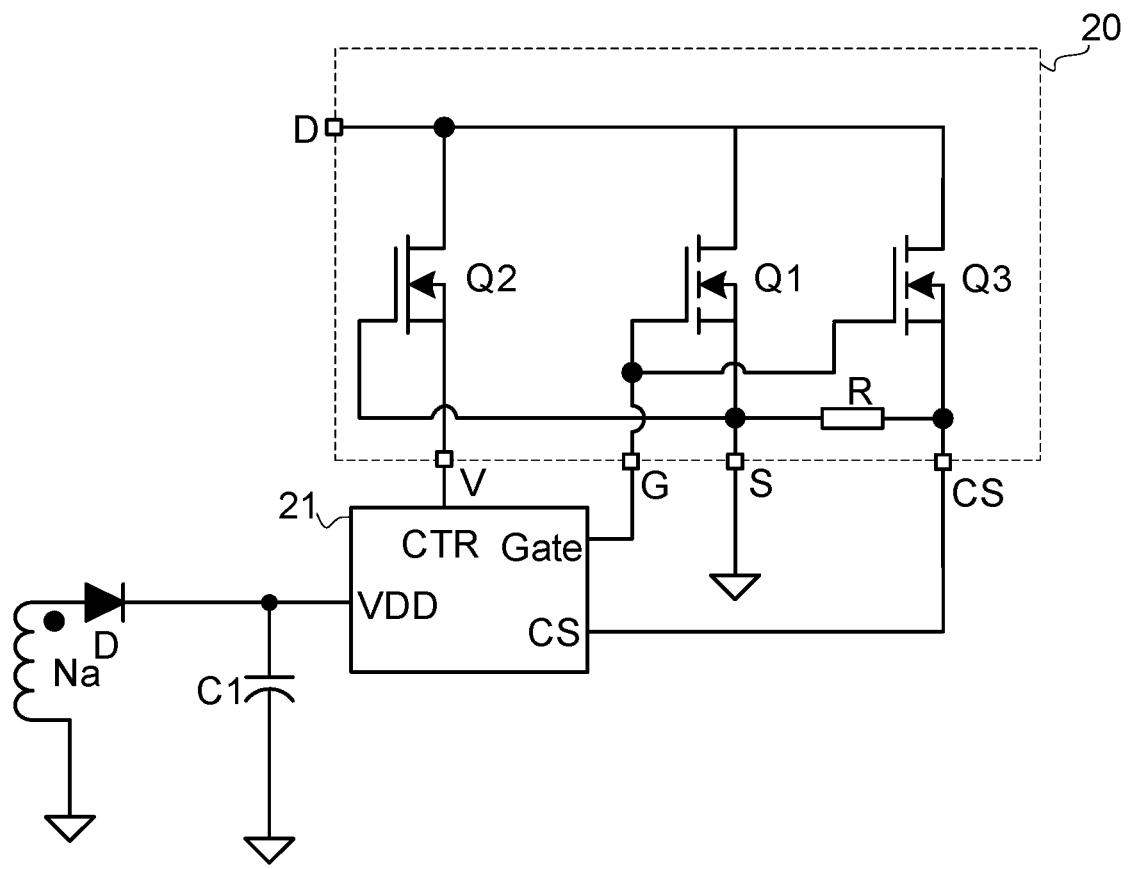
FIG. 4 illustrates a circuit diagram of a transistor module having start up function and current sensing function according to an embodiment of the present invention.

FIG. 4 illustrates a circuit diagram of a transistor module 20 combining start up function and current sensing function according to an embodiment of the present invention. The transistor module 20 has five terminals, which are drain terminal D, source terminal S, start up terminal V, control terminal G and sensing terminal CS respectively. Compared to the transistor module 10 in FIG. 2, transistor module 20 further has a sensing terminal CS, which is coupled to a third terminal CS of control circuit 21 besides terminals CTR and Gate, to provide a current sensing function, and thus control circuit 21 may control the current flowing through transistor Q1 based on the current sensing signal CS. The transistor module 20 further comprises a third transistor besides transistor Q1 and Q2, wherein a first end of transistor Q3 is coupled to the first end (drain) of transistor Q1, a control end of transistor Q3 is coupled to the control end of transistor of Q1, a second end of transistor Q3 is coupled to the second end (source) of the first transistor Q1 through a resistor R, and the second end of transistor Q3 is used to provide the current sensing signal. In the shown embodiment, the third transistor Q3 comprises a MOSFET, where the first end is the drain, the second end is the source and the control end is the gate. With the configuration, the current flowing through transistor Q3 is proportional to the current flowing through transistor Q1 and the voltage at sensing terminal CS is proportional to the current flowing through transistor Q1, or in other words, the voltage at terminal CS is proportional to the current flowing out of terminal S. Resistor R can be manufactured with any method suitable for semiconductor processing. Since resistor R is small, resistor R may be manufactured easily by doping in certain region.

In one embodiment, a transistor module comprising start up function and current sensing function are manufactured on a semiconductor substrate to form a semiconductor module or a semiconductor chip, wherein the semiconductor chip has five pins/terminals, including a drain pin D, a source pin, a start up pin V, a control pin G and a sensing pin CS. Wherein the drain pin D is coupled to the first end (drain) of the first transistor Q1, the first end (drain) of the second transistor Q2 and the first end (drain) of the third transistor Q3, the second pin S is coupled to the second end (source) of the first transistor Q1, one end of the resistor R and the control end (gate) of the second transistor Q2, the third pin G is coupled to the control end (gate) of the first transistor Q1, the fourth pin V is coupled to the second end (source) of the second transistor Q2 and the fifth pin CS is coupled to the second end (source) of the third transistor Q3 and the other end of the resistor R. In one embodiment, one pin may comprise two or more sub-pins which are electrically coupled together.

Figure 5:
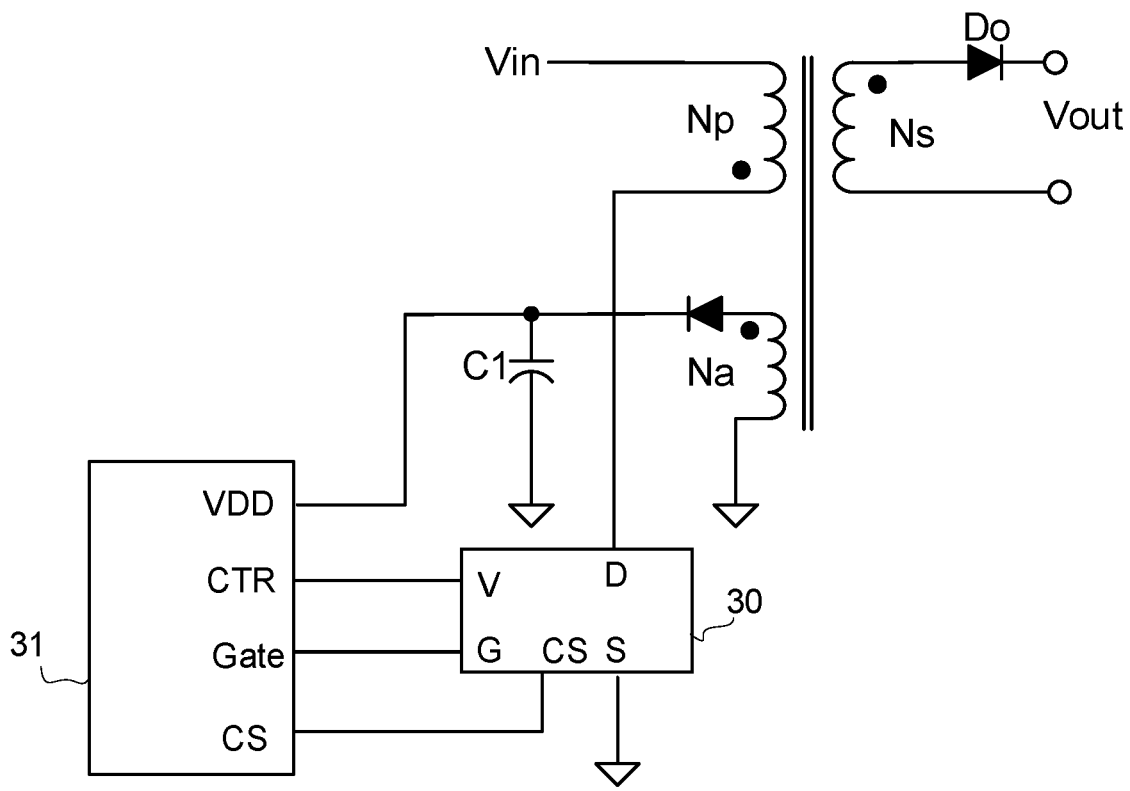
FIG. 5 illustrates a circuit diagram of a power converter according to an embodiment of the present invention.

FIG. 5 illustrates a circuit diagram of a power converter according to an embodiment of the present invention. The power converter comprises a primary side winding Np, a transistor module 30 coupled to the primary side winding Np, a control circuit 31, a secondary side winding Ns, an auxiliary winding Na and a capacitor C1. Wherein one end of the primary side winding Np receives an input voltage Vin, and the other end of the primary side winding Np is coupled to the transistor module 30, and to be specific, coupled to a power switch comprising a power transistor in the transistor module 30. In one embodiment, the transistor module 30 is in a form of a semiconductor module. The control circuit 31 has a first terminal CTR and a second terminal Gate which are coupled to the transistor module/semiconductor module 30, wherein the first terminal CTR is used to receive start up current from the fourth terminal V of the transistor module 30, and the second terminal Gate is used to control the power transistor/power switch in the transistor module. The secondary side winding Ns is coupled to a secondary side rectifier Do to provide an output voltage Vout. The capacitor C1 is coupled to the auxiliary winding Na and a third terminal VDD of the control circuit 31. At start up stage, the system starts up, and the input impedance at the input terminal CTR of the control circuit 31 is low, such as lower than a first resistance value, the transistor module/semiconductor module 30 supplies start up current to the control circuit 31 for charging capacitor C1, and to provide start up voltage for the control circuit. Accordingly, the control circuit 31 starts to provide control signal to the power switch and the system starts to work. Under the switching action of the power switch, energy is transferred from the primary side winding Np to the secondary side winding Ns and to provide the output voltage Vout at the output terminal, and at the meantime, energy is transferred to the auxiliary winding Na and charges capacitor C1. The voltage at terminal VDD increases and the voltage at the second terminal CTR of the control circuit 31 increases accordingly. When the system enters normal operation state at operation stage, since the voltage at terminal CTR is high, and the input impedance at the first terminal CTR of control circuit 31 is high, for example, higher than a second resistance value, the start up transistor in the transistor module 30 is in OFF state, and capacitor C1 is supplied entirely by the auxiliary winding Na. Wherein the first resistance value is much lower than the second resistance value. It is noted that the parameters of the first resistance value and the second resistance value may be not set in the transistor module or the control circuit, but rather adopted for ease of illustration purpose.

According to some embodiments of the present invention, a transistor module with start up function is achieved by adding only one additional transistor, fulfilling providing start up current for the control circuit. The transistor module requires no additional resistor for providing the start up function, and the power consumption is very low and the semiconductor processing is simple. At the meantime, with the configuration in the transistor module, it requires only four pins, the integration density is high and the control is simple.

It will be appreciated by persons skilled in the art that the present invention is not limited to what has been particularly shown and described herein above. Rather the scope of the present invention is defined by the claims and includes both combinations and sub-combinations of the various features described herein above as well as variations and modifications thereof which would occur to persons skilled in the art upon reading the foregoing description and which are not in the prior art.

I claim:

1. A transistor module, comprising:
   a first transistor having a first end, a second end and a control end; and
   a second transistor configured to provide start up current for a control circuit, the second transistor having a first end, a second end and a control end, wherein the first end of the first transistor is coupled to the first end of the second transistor, the second end of the first transistor is coupled to the control end of the second transistor, and the second end of the second transistor is configured to provide the start up current, wherein:
   at start up stage, the first transistor is in OFF state, and the second transistor is in ON state; and
   at operation stage, the first transistor is in operation state, and the second transistor is in OFF state, and
   wherein the transistor module is manufactured on a semiconductor substrate to form a semiconductor chip, wherein the semiconductor chip has four pins, and wherein a first pin of the semiconductor chip is coupled to the first end of the first transistor and the first end of the second transistor, a second pin of the semiconductor chip is coupled to the second end of the first transistor and the control end of the second transistor, a third pin of the semiconductor chip is coupled to the control end of the first transistor and a fourth pin of the semiconductor chip is coupled to the second end of the second transistor.

2. The transistor module of claim 1, wherein the fourth pin is coupled to a first terminal of the control circuit and the third pin is coupled to a second terminal of the control circuit.

3. The transistor module of claim 2, wherein:
   when the input impedance at the first terminal of the control circuit is lower than a first value, the second transistor is in ON state; and
   when the input impedance at the first terminal of the control circuit is higher than a second value, the second transistor is in OFF state, and wherein the first value is lower than the second value.

4. A transistor module, comprising:
   a first transistor having a first end, a second end and a control end; and
   a second transistor configured to provide start up current for a control circuit, the second transistor having a first end, a second end and a control end, wherein the first end of the first transistor is coupled to the first end of the second transistor, the second end of the first transistor is coupled to the control end of the second transistor, and the second end of the second transistor is configured to provide the start up current, wherein:
   at start up stage, the first transistor is in OFF state, and the second transistor is in ON state; and
   at operation stage, the first transistor is in operation state, and the second transistor is in OFF state, further wherein
   [The transistor module of claim 1, wherein] the first transistor comprises an enhancement mode Field Effect Transistor (FET), and the second transistor comprises a depletion mode FET, wherein the drain of the first transistor is coupled to the drain of the second transistor, the gate of the second transistor is coupled to the source of the first transistor, and wherein:
   when the source-gate voltage of the second transistor is lower than a first threshold, the conduction channel of the second transistor exists and the second transistor is in ON state; and
   when the source-gate voltage of the second transistor is higher than a second threshold, the conduction channel of the second transistor pinches off and the second transistor is in OFF state, and wherein the second threshold is higher than the first threshold.

5. A transistor module, comprising:
   a first transistor having a first end, a second end and a control end; and
   a second transistor configured to provide start up current for a control circuit, the second transistor having a first end, a second end and a control end, wherein the first end of the first transistor is coupled to the first end of the second transistor, the second end of the first transistor is coupled to the control end of the second transistor, and the second end of the second transistor is configured to provide the start up current, wherein:
   (i) at start up stage, the first transistor is in OFF state, and the second transistor is in ON state; and
   (ii) at operation stage, the first transistor is in operation state, and the second transistor is in OFF state, and
   further comprising a third transistor for providing a current sensing signal to the control circuit, wherein the third transistor has a first end coupled to the first end of the first transistor, a control end coupled to the control end of the first transistor, and a second end coupled to the second end of the first transistor through a resistor, and the second end of the third transistor is used to provide the current sensing signal;
   further wherein the transistor module is manufactured on a semiconductor substrate to form a semiconductor chip, and the semiconductor chip having:
   a first pin coupled to the first end of the first transistor, the first end of the second transistor and the first end of the third transistor;
   a second pin coupled to the second end of the first transistor, one end of the resistor and the control end of the second transistor;
   a third pin coupled to the control end of the first transistor;
   a fourth pin coupled to the second end of the second transistor; and
   a fifth pin coupled to the second end of the third transistor and the other end of the resistor.

* * * * *